US006915179B2

(12) United States Patent
Emoto

(10) Patent No.: US 6,915,179 B2
(45) Date of Patent: Jul. 5, 2005

(54) PIPE STRUCTURE, ALIGNMENT APPARATUS, ELECTRON BEAM LITHOGRAPHY APPARATUS, EXPOSURE APPARATUS, EXPOSURE APPARATUS MAINTENANCE METHOD, SEMICONDUCTOR DEVICE MANUFACTURING METHOD, AND SEMICONDUCTOR MANUFACTURING FACTORY

(75) Inventor: Keiji Emoto, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 301 days.

(21) Appl. No.: 09/833,766

(22) Filed: Apr. 13, 2001

(65) Prior Publication Data

US 2002/0000029 A1 Jan. 3, 2002

(30) Foreign Application Priority Data

Apr. 13, 2000 (JP) ....................................... 2000-112216

(51) Int. Cl.$^{7}$ ................................................ F16L 11/20
(52) U.S. Cl. ....................................... 700/121; 138/114
(58) Field of Search ........................... 700/96, 117, 121, 700/166; 138/111, 114, 140; 702/184, 188

(56) References Cited

U.S. PATENT DOCUMENTS 3,743,760 A * 7/1973 Sassin ....................... 174/15.5
4,368,219 A * 1/1983 Nagata et al. .............. 427/236
4,475,223 A * 10/1984 Taniguchi et al. ............ 378/34
4,906,496 A * 3/1990 Hosono et al. ............ 428/36.9
4,993,696 A * 2/1991 Furukawa et al. ............ 269/73
5,611,655 A * 3/1997 Fukasawa et al. .......... 414/217
5,829,483 A * 11/1998 Tukahara et al. ........... 138/109
5,837,316 A * 11/1998 Fuchita ....................... 427/191
5,978,578 A * 11/1999 Azarya et al. .............. 717/100
6,061,174 A * 5/2000 Shiozawa et al. ........... 359/361
6,110,274 A * 8/2000 Okuno ........................ 117/81
6,246,204 B1 * 6/2001 Ebihara et al. ............. 318/649
6,385,497 B1 * 5/2002 Ogushi et al. .............. 700/110
6,440,504 B1 * 8/2002 Akiyama .................... 427/569
2001/0017164 A1 * 8/2001 Fukui et al. ................ 138/125

* cited by examiner

*Primary Examiner*—Paul Rodriguez
(74) *Attorney, Agent, or Firm*—Fitzpatrick, Cella, Harper & Scinto

(57) ABSTRACT

A pipe structure includes a double pipe having a resin inner pipe and a resin outer pipe covering an outside of the inner pipe, and a discharge mechanism for discharging fluid in a space between the inner pipe and the outer pipe. The double pipe is used in a vacuum chamber having a vacuum atmosphere.

10 Claims, 8 Drawing Sheets

TO VACUUM PUMP
1
5
8
7
2
3
10
4
7
GAS
LIQUID

FIG. 9

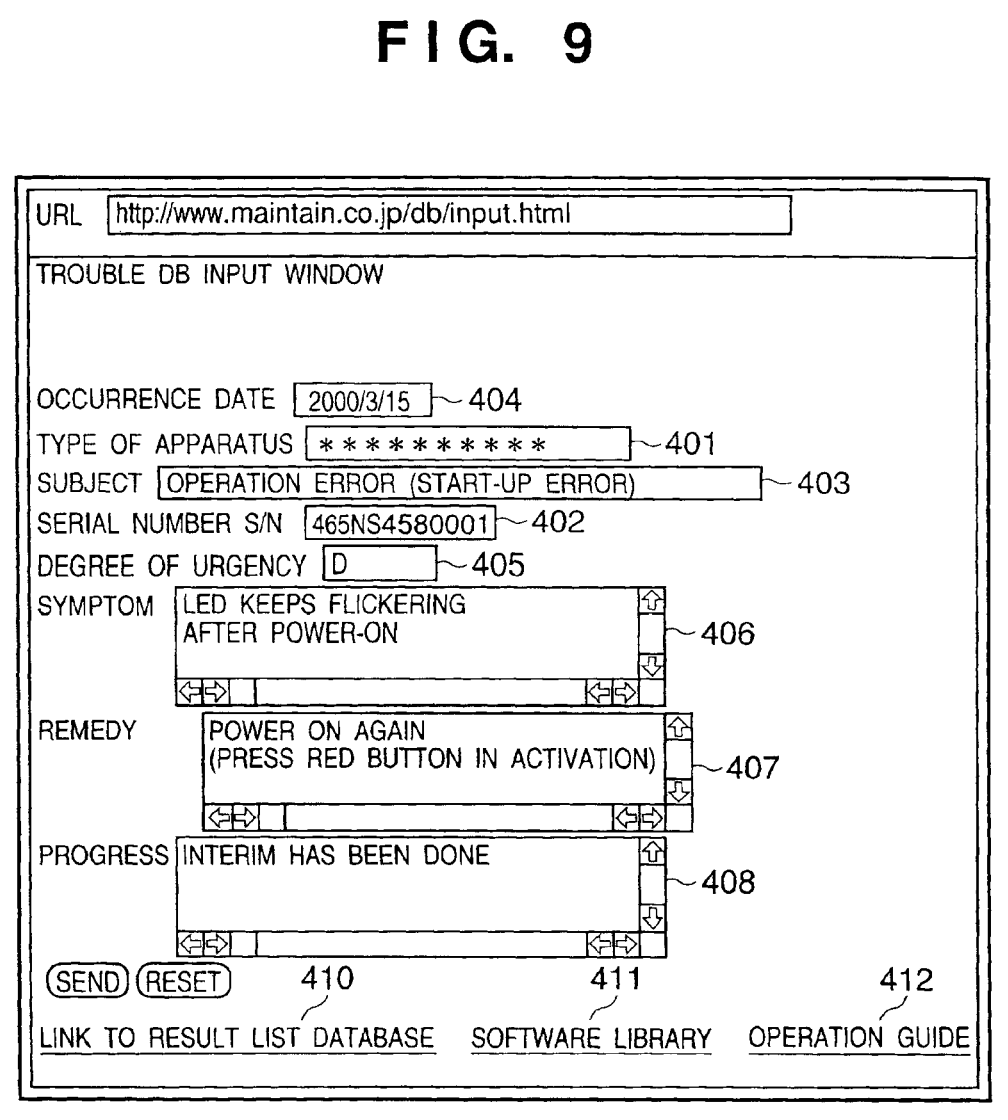

URL http://www.maintain.co.jp/db/input.html

TROUBLE DB INPUT WINDOW

OCCURRENCE DATE 2000/3/15 ~404

TYPE OF APPARATUS ********** ~401

SUBJECT OPERATION ERROR (START-UP ERROR) ~403

SERIAL NUMBER S/N 465NS4580001 ~402

DEGREE OF URGENCY D ~405

SYMPTOM LED KEEPS FLICKERING AFTER POWER-ON ~406

REMEDY POWER ON AGAIN (PRESS RED BUTTON IN ACTIVATION) ~407

PROGRESS INTERIM HAS BEEN DONE ~408

SEND RESET

410 LINK TO RESULT LIST DATABASE

411 SOFTWARE LIBRARY

412 OPERATION GUIDE

SEMICONDUCTOR DEVICE MANUFACTURING FLOW

PIPE STRUCTURE, ALIGNMENT APPARATUS, ELECTRON BEAM LITHOGRAPHY APPARATUS, EXPOSURE APPARATUS, EXPOSURE APPARATUS MAINTENANCE METHOD, SEMICONDUCTOR DEVICE MANUFACTURING METHOD, AND SEMICONDUCTOR MANUFACTURING FACTORY

FIELD OF THE INVENTION

The present invention relates to a pipe structure, an alignment apparatus, an electron beam lithography apparatus, an exposure apparatus, an exposure apparatus maintenance method, a semiconductor device manufacturing method, and a semiconductor manufacturing factory capable of maintaining a vacuum atmosphere having a medium to high vacuum degree at a high precision by preventing any adverse effect such as a decrease in vacuum degree in a vacuum chamber caused by degassing, gas permeation, or the like, from a pipe structure connected to externally supplied fluid such as gas (or liquid) in order to drive the alignment apparatus arranged in the evacuated vacuum chamber.

BACKGROUND OF THE INVENTION

A metal pipe has conventionally been used to suppress a decrease in vacuum degree in a vacuum chamber by degassing or gas permeation from a pipe when the interior and exterior of the vacuum chamber evacuated to a medium to high vacuum atmosphere are connected via the pipe and gas (or liquid) is supplied to or discharged from the interior/exterior of the vacuum chamber. A pipe for driving an alignment apparatus arranged in the vacuum chamber is generally a metal pipe having a flexible bellows structure in order to ensure the flexibility.

FIG. 12 is a schematic view showing an alignment apparatus arranged in a conventional vacuum chamber and its pipe. As shown in FIG. 12, an object 502 in a vacuum chamber 501 held in a high vacuum is precisely aligned by driving a stage 503 on a surface plate 504 by gas (or fluid). Since the stage 503 requires supply and discharge of fluid such as gas (or liquid), the interior and exterior of the vacuum chamber 501 communicate with each other via a flange 505 and metal pipes 506 having a bellows structure. An arrow shown above the stage 503 in FIG. 12 indicates the movable direction of the stage 503.

The use of the metal pipes connected to the alignment apparatus arranged in the vacuum chamber has the advantage that almost no degassing or gas permeation from the pipes occurs, but suffers from the following two serious problems.

(i) Because of low flexibility (high flexural rigidity), the load resistance of movement is high. In other words, a force in deforming the pipes acts as a disturbance factor to the stage 503, which adversely influence the alignment precision.

(ii) Repetitive deformation of the metal pipes 6 readily causes metal fatigue and decreases the durability.

In particular, the alignment precision of the high-precision stage 503 is adversely influenced by the nonlinear piping force of even a pipe made of a flexible resin material. For this reason, the low flexibility of the metal pipe poses a serious problem, and demands are arising for a flexible pipe usable in a vacuum chamber. The metal pipe may be replaced by a pipe made of a flexible resin material. In general, a resin material exhibits a larger amount of degassing or gas permeation than a metal pipe, so a resin pipe is difficult to directly use in a medium to high vacuum atmosphere.

SUMMARY OF THE INVENTION

The present invention has been made to overcome the conventional drawbacks, and has as its object to provide a pipe structure which is higher in flexibility and durability than a conventional metal pipe and is connected to an alignment apparatus arranged in a vacuum chamber. It is another object of the present invention to provide a pipe structure which also prevents the influence of degassing from an electrical wire.

To overcome the above problems and to achieve the above objects, a pipe structure according to the first aspect of the present invention comprises a double pipe having a resin inner pipe and a resin outer pipe covering an outside of the inner pipe, and a discharge mechanism for discharging fluid in a space between the inner pipe and the outer pipe.

A pipe structure according to the second aspect of the present invention comprises a double pipe having at least one inner pipe and/or at least one electrical wire and a resin outer pipe covering outsides of the inner pipe and/or the electrical wire, and a discharge mechanism for discharging fluid in a space between the inner pipe and/or the electrical wire and the outer pipe.

An alignment apparatus according to the present invention comprises the pipe structure according to the first aspect and is arranged in a vacuum chamber.

An electron beam lithography apparatus according to the present invention comprises the alignment apparatus.

An exposure apparatus according to the present invention comprises the alignment apparatus.

A semiconductor device manufacturing method according to the present invention comprises the steps of installing manufacturing apparatuses for performing various processes, including the exposure apparatus, in a semiconductor manufacturing factory, and manufacturing a semiconductor device by using the manufacturing apparatuses in a plurality of processes.

A semiconductor manufacturing factory according to the present invention comprises manufacturing apparatuses for performing various processes, including the exposure apparatus, a local area network for connecting the manufacturing apparatuses, and a gateway which allows the local area network to access an external network outside the factory, wherein information about at least one of the manufacturing apparatuses can be communicated.

According to the present invention, a maintenance method for the exposure apparatus installed in the semiconductor manufacturing factory comprises the steps of causing a vendor or user of the exposure apparatus to provide a maintenance database connected to an external network of the semiconductor manufacturing factory, authorizing access from the semiconductor manufacturing factory to the maintenance database via the external network, and transmitting maintenance information accumulated in the maintenance database to the semiconductor manufacturing factory via the external network.

The exposure apparatus further comprises a display, a network interface, and a computer for executing network software, and maintenance information of the exposure apparatus is communicated via the computer network.

Other objects and advantages besides those discussed above shall be apparent to those skilled in the art from the description of a preferred embodiment of the invention which follows. In the description, reference is made to accompanying drawings, which form a part thereof, and which illustrate an example of the invention. Such an example, however, is not exhaustive of the various embodiments of the invention, and, therefore, reference is made to the claims which follow the description for determining the scope of the invention.

BRIEF DESCRIPTION OF THE DRAWINGS

FIG. 9 is a view showing an example of a user interface in the semiconductor device production system including the exposure apparatus according to the embodiment of the present invention;

DETAILED DESCRIPTION OF THE PREFERRED EMBODIMENTS

Preferred embodiments of the present invention will be described in detail below with reference to the accompanying drawings.

The following embodiments are merely examples of the implementation means of the present invention, and the present invention can be applied to modifications of the following embodiments within the spirit and scope of the invention.

[First Embodiment]

Figure 1:
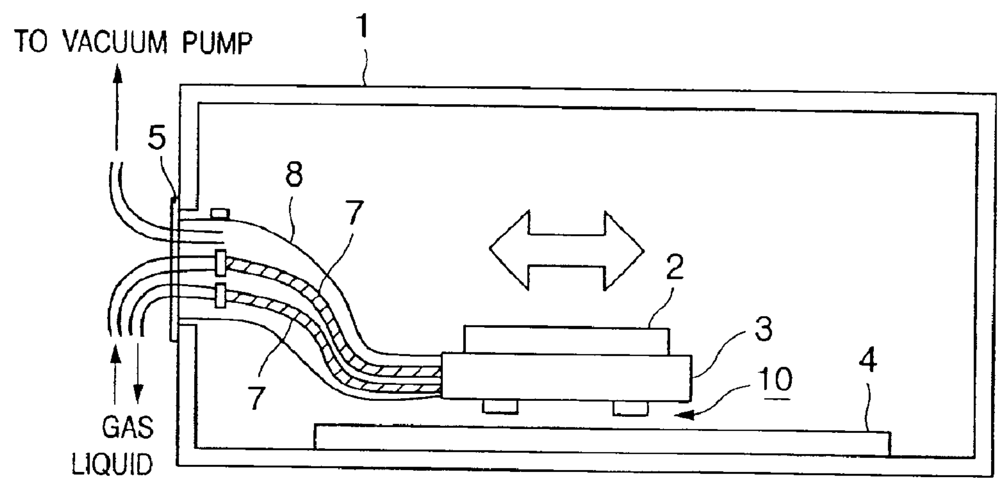
FIG. 1 is a schematic view showing the main part of an alignment apparatus arranged in a vacuum chamber according to the first embodiment of the present invention.

FIG. 1 is a schematic view showing the main part of an alignment apparatus arranged in a vacuum chamber according to the first embodiment of the present invention, and shows the present invention best.

In FIG. 1, reference numeral 1 denotes a vacuum chamber whose interior is controlled to a vacuum atmosphere. The vacuum chamber 1 has a vacuum pump (not shown). Gas in the vacuum chamber 1 is discharged by the vacuum pump, and the interior of the vacuum chamber is controlled to a medium to high vacuum atmosphere.

Reference numeral 3 denotes a stage which is movable on a surface plate 4 having a reference surface by a driving mechanism (not shown). An object 2 to be aligned is held by a chuck (not shown) on the stage 3.

The stage 3 is supported above the surface plate 4 in a non-contact manner by a bearing mechanism 10.

Figure 2:
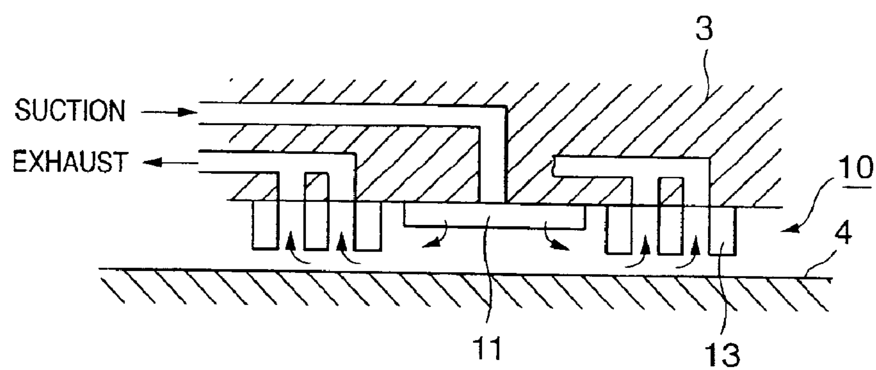
FIG. 2 is a sectional view for explaining the driving mechanism of the alignment apparatus in FIG. 1.

The bearing mechanism 10 will be explained with reference to FIG. 2. In FIG. 2, the same reference numerals as those in FIG. 1 denote the same parts.

The bearing mechanism 10 comprises an air pad 11 and labyrinth partition 13. The air pad 11 is attached to the stage 3, and sprays air supplied from a suction pipe to the surface plate. The air sprayed from the air pad 11 supports the stage 3 above the surface plate 4 in a non-contact manner.

In this case, leakage of air sprayed from the air pad 11 into the vacuum chamber 1 is undesirable. To prevent this, the labyrinth partition 13 having a plurality of partitions is arranged to surround the air pad 11, exhaust ports are formed between the partitions of the labyrinth partition 13, and forced evacuation is done to prevent leakage of the air from the air pad 11 to the vacuum chamber 1.

That is, the stage 3 is coupled to the suction and exhaust pipes in order to support the stage 3 by the bearing mechanism 10.

The driving mechanism for driving the stage 3 generates heat in driving it. A temperature adjustment gas or liquid for adjusting the temperature of the driving mechanism must be supplied to a heating portion, and the temperature adjustment gas or liquid which has recovered heat must be recovered. For this purpose, the stage 3 is coupled to pipes for supplying and discharging the temperature adjustment gas or liquid.

As described above, the stage 3 is coupled to various pipes for supplying or discharging fluid such as gas (or liquid) used to drive the stage 3. The gas (or liquid) supplied to or discharged from the stage 3 is circulated between the stage 3 and the exterior of the vacuum chamber. To align the stage 3 at a high precision, a piping disturbance must be removed as much as possible. Hence, pipes 7 are flexible resin pipes which supply gas (or liquid) to the stage 3 via a flange 5 attached to the vacuum chamber 1.

In general, compared to a metal pipe, a resin pipe causes more "degassing" which is a release of a constituent material or the like from a pipe surface to a vacuum atmosphere or "permeation" which is permeation of gas (or liquid) in a pipe to the outside. Depending on the ratio of pipes used, such gas obstructs an increase in vacuum degree in the vacuum chamber to a desired level. Depending on the material, the degassing amount is often negligible. However, the permeation amount is very large, especially when a high-pressure gas (or liquid) flows through the pipe, so the vacuum degree in the vacuum chamber is adversely influenced. As a measure against this problem, the pipe is made thick in order to reduce the permeation amount, by exploiting the fact that the gas permeation amount is proportional to the pressure difference between the pipe interior and the atmosphere and is inversely proportional to the pipe thickness. When, however, a resin pipe is actually used, a thick pipe degrades the flexibility, which is the most significant advantage of the resin pipe.

Figure 3:
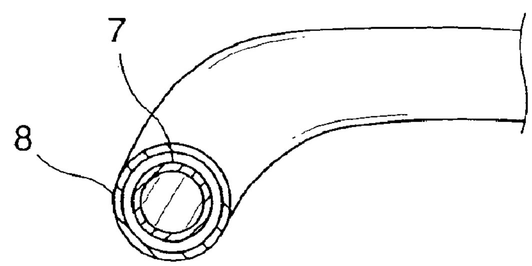
FIG. 3 is a view showing a pipe structure when a single resin pipe is airtightly covered with a thin fluoroplastic pipe in the first embodiment.
Figure 4:
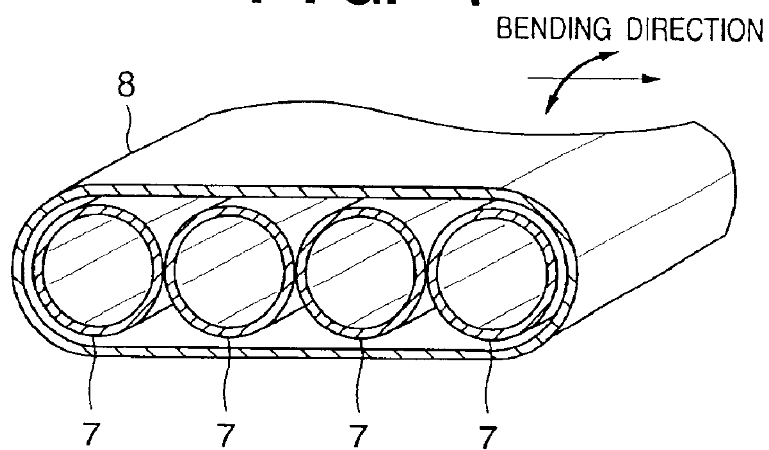
FIG. 4 is a perspective view showing a pipe structure when a plurality of resin pipes are airtightly covered with a thin fluoroplastic pipe in the first embodiment.

The first embodiment suppresses degassing or gas permeation by airtightly covering the outsides of the pipes 7 with a thin fluoroplastic pipe 8 so as to prevent the influence of degassing or gas permeation from the resin pipes 7 on the internal atmosphere of the vacuum chamber 1. The pipe 8 is shown in detail in FIGS. 3 and 4. FIG. 3 shows a sealing structure for one pipe, and FIG. 4 shows a sealing structure for a plurality of pipes. As is apparent from FIGS. 3 and 4, the vacuum pipe of this embodiment has a double structure in which the internal pipe 7 is sealed by the outer pipe 8 so as not to be exposed to the internal atmosphere of the vacuum chamber 1. Further, as shown in FIG. 1, the space (airtight space) between the inner pipe 7 and the outer pipe 8 is connected via the flange 5 to a vacuum pump serving as an evacuation mechanism, and is kept in a low vacuum.

This vacuum pump is different from a vacuum pump for maintaining the vacuum degree in the vacuum chamber 1 so as to prevent the adverse effect of degassed or permeating gas to the interior of the vacuum chamber 1. The vacuum pump for maintaining the vacuum degree in the vacuum chamber 1 is often a turbo molecular pump which can evacuate the interior of the vacuum chamber 1 to a high vacuum, but is expensive and cumbersome to handle. However, the vacuum pump connected to the vacuum pipe of the first embodiment is, e.g., a low-cost scroll pump, which is easy to handle because the interior of the vacuum chamber suffices to be evacuated to a low vacuum at a low evacuation speed.

This arrangement prevents leakage of gas degassed or permeating from the inner pipe 7 into the vacuum chamber 1. That is, a large amount of gas is degassed or permeates from the inner pipe 7, but is recovered by the vacuum pump. The vacuum pump maintains the airtight space between the inner pipe 7 and the outer pipe 8 in a proper low vacuum, so that the pressure difference between the interior and exterior of the outer pipe 8 can be considered to be almost zero. For example, even if the vacuum degree in the vacuum chamber 1 is as high as $10^{-6}$ [Pa], and the vacuum degree in the space between the inner pipe 7 and the outer pipe 8 is as low as 1 [Pa], the pressure difference may be as small as almost 1 [Pa]. For this reason, almost no gas permeates from the outer pipe 8.to the vacuum chamber 1. Since the pressure difference applied to the outer pipe 8 is very small, the outer pipe 8 can be made very thin in terms of strength, i.e., can ensure prescribed flexibility. However, gas is degassed from the outer pipe 8 into the vacuum chamber 1 directly, so the material of the outer pipe 8 must be almost free from degassing.

From this, the inner pipe 7 hardly causes degassing or gas permeation, and thus, a polyurethane or polyolefin resin pipe is used by giving priority to flexibility. If necessary, the pipe is formed into a bellows structure or coil shape. The outer pipe 8 is made of a fluoroplastic in order to reduce degassing, and is made very thin, with a thickness of 50 $\mu$m in order to ensure prescribed flexibility. The outer pipe 8 is further formed into a bellows structure or coil shape. The thickness of the outer pipe 8 is about 10 $\mu$m to 100 $\mu$m at which a flexibility necessary for alignment can be ensured and the outer pipe 8 can attain a sufficient strength. Another example of the resin almost free from degassing is a polyimide resin. The material can be selected to some extent in consideration of a desired vacuum degree, the vacuum pump, and the degassing amount of the material.

The flexibility of the resin pipe has been described as an advantage. Another reason of adopting the resin pipe is that the resin pipe is more resistant to repetitive deformation than a metal pipe and is expected to have increased reliability of durability. The resistance to repetitive deformation meets demands such as (i) in many cases, an apparatus in a vacuum chamber is difficult to receive maintenance, and an exchange of components is preferably minimized, and (ii) the durability must be high when a movable member (stage) is frequently, repetitively moved with a large stroke.

The advantage of the double pipe includes not only suppression of the influence of degassing or gas permeation but also an increase in the reliability of the vacuum pipe. If the pipe suddenly cracks in a high vacuum, gas (or liquid) passing through the pipe leaks into the vacuum chamber 1, and the vacuum degree in the vacuum chamber 1 abruptly drops. At this time, the turbo molecular pump or oil diffusion pump which can only be used in a medium or high vacuum may break, to seriously damage the overall chamber system. In the arrangement of the first embodiment, however, no gas flows into the vacuum chamber 1 unless the inner and outer pipes 7 and 8 simultaneously leak gas. In general, either pipe may deteriorate earlier. If only the inner pipe 7 leaks gas, the pressure of the airtight space between the inner pipe 7 and the outer pipe 8 increases. Accordingly, the gas permeation amount of the outer pipe 8 increases to increase the internal pressure of the vacuum chamber. As the outer pipe 8 seals leakage gas to a certain degree, the pressure is expected to change slower than in the case of direct leakage. Hence, any damage to the chamber system can be minimized by an appropriate measure taken immediately after generation of leakage. If only the outer pipe 8 leaks gas, the vacuum degree in the vacuum chamber 1 slightly decreases, which does not damage the vacuum pump and chamber system, in most cases.

An electron beam lithography apparatus is desirably equipped with a wafer stage connected to the above-described pipes in order to irradiate a wafer with an electron beam in a vacuum atmosphere.

In the first embodiment, the interior of the chamber 1 is controlled to a vacuum atmosphere, but is not limited to this. If the interior of the chamber 1 is controlled to a predetermined gas atmosphere such as an inert gas atmosphere, and degassing from a resin pipe poses a problem, a pipe according to the first embodiment can be adopted. For example, this pipe may be used in an exposure apparatus in which a wafer stage must be controlled in a nitrogen or helium atmosphere. An example of this exposure apparatus is one using an $F_2$ or Ar laser as a light source.

An example of an outer pipe 8 in which a plurality of inner pipes 7 are arranged, as shown in FIG. 4, will be described. In the first embodiment, if a plurality of pipes are required, as shown in FIG. 4, the inner pipes 7 are covered at once with the outer pipe 8 and aligned one-dimensionally in the longitudinal direction of the pipe section so as to reduce the flexural rigidity in a direction in which a movable member (stage) moves. By gathering the inner pipes 7, the number of outer pipes 8 can be decreased. As a result, degassing from the outer pipe 8 can be reduced, and the flexural rigidity of the outer pipe 8 can be decreased by the decrease in the number of outer pipes 8. This layout of the inner pipes 7 can decrease the flexural rigidity of all the inner pipes 7 and that of the double pipe.

[Second Embodiment]

Figure 5:
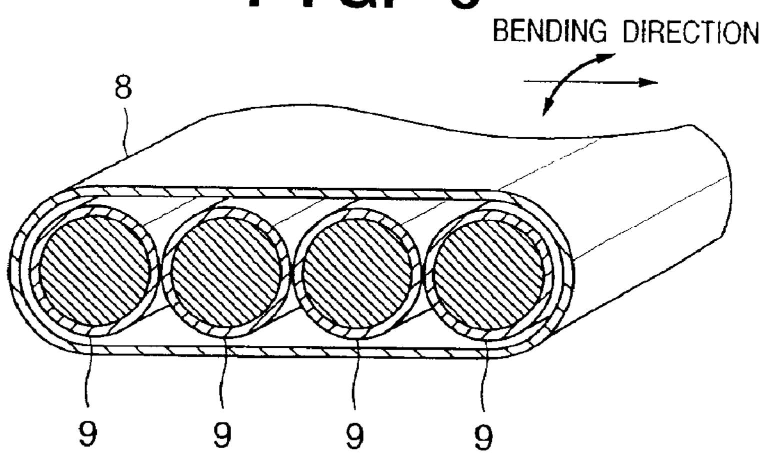
FIG. 5 is a perspective view showing a pipe structure when a vacuum sealing structure according to the second embodiment is applied to an electrical wire.

FIG. 5 shows an example when a vacuum sealing structure according to the second embodiment of the present invention is applied to an electrical wire. In general, an electrical wire also often uses a fluoroplastic-coated wire in order to reduce degassing from the coated portion of the wire. However, the fluoroplastic coating is poorer in flexibility than general coating, and is not appropriate for connection to a movable member (stage), similar to a pipe. To form electrical wires 9 almost free from degassing while maintaining prescribed flexibility, the electrical wires 9 are covered with a fluoroplastic outer pipe 8 having a small thickness (e.g., several tens of $\mu$m), and the interior of the outer pipe 8 is kept in a low vacuum by a pump. Thus, even if the electrical wire 9 itself is formed from a flexible wire such as a vinyl-coated wire regardless of degassing, degassing does not influence a high vacuum atmosphere. This is because the pressure difference is almost zero and no gas permeation occurs between the interior and exterior of the outer pipe 8, similar to the first embodiment. Since the fluoroplastic outer pipe 8 is thin, prescribed flexibility can be ensured, and the electrical wire 9 is more flexible than a conventional fluoroplastic-coated electrical wire 9.

Figure 6:
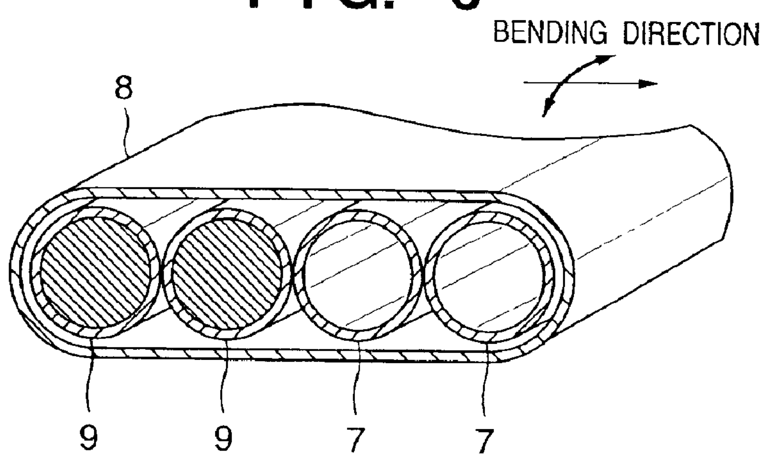
FIG. 6 is a perspective view showing a pipe structure in which pluralities of pipes and wires are simultaneously applied to a vacuum sealing structure when both the pipes and electrical wires must be connected to the alignment apparatus arranged in the vacuum chamber.

When both inner pipes 7 for gas (or liquid) and the electrical wires 9 must be connected to the movable member (stage) in the vacuum chamber, they are incorporated in the fluoroplastic outer pipe 8, as shown in FIG. 6, which simplifies piping of the movable member (stage). FIG. 6 shows a pipe structure in which pluralities of pipes and wires are simultaneously applied to a vacuum sealing structure when both the internal pipes and electrical wires must be connected to the movable member (stage) in the vacuum chamber.

In FIGS. 5 and 6, similar to the first embodiment, the electrical wires 9 and inner pipes 7 are one-dimensionally aligned to reduce the flexural rigidity of all the pipes in a direction in which the pipes are bent by movement.

[Embodiment of A Semiconductor Production System]

A production system for a semiconductor device (e.g., a semiconductor chip such as an IC or LSI, a liquid crystal panel, a CCD, a thin film magnetic head, a micromachine, or the like) using the exposure apparatus will be exemplified. A trouble remedy or periodic maintenance of a manufacturing apparatus installed in a semiconductor manufacturing factory, or maintenance service such as software distribution is performed by using, e.g., a computer network outside the manufacturing factory.

Figure 7:
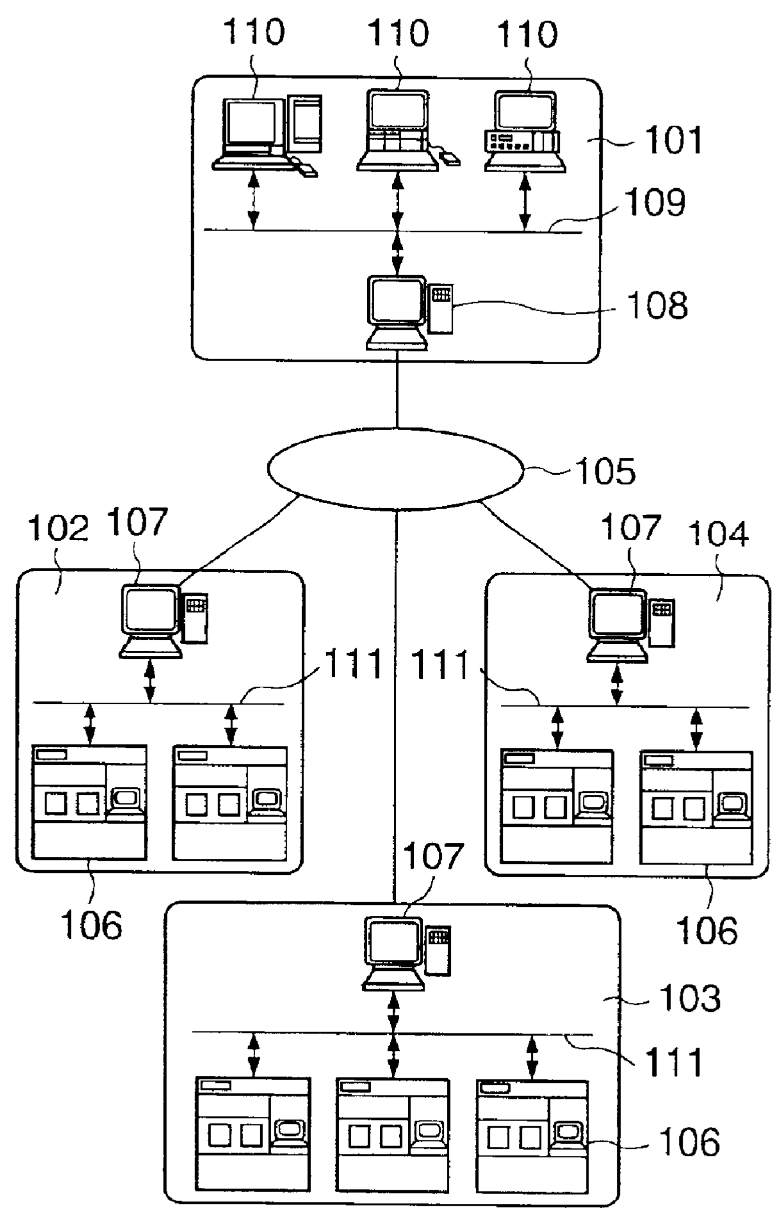
FIG. 7 is a view showing the concept of a semiconductor device production system including an exposure apparatus according to an embodiment of the present invention when viewed from a given angle.

FIG. 7 shows the overall system cut out at a given angle. In FIG. 7, reference numeral 101 denotes a business office of a vendor (apparatus supply manufacturer) which provides a semiconductor device manufacturing apparatus. Assumed examples of the manufacturing apparatus are semiconductor manufacturing apparatuses for performing various processes used in a semiconductor manufacturing factory, such as pre-process apparatuses (lithography apparatus including an exposure apparatus, a resist processing apparatus, and an etching apparatus, an annealing apparatus, a film formation apparatus, a planarization apparatus, and the like) and post-process apparatuses (e.g., an assembly apparatus, an inspection apparatus, and the like). The business office 101 comprises a host management system 108 for providing a maintenance database for the manufacturing apparatus, a plurality of operation terminal computers 110, and a LAN (Local Area Network) 109, which connects the host management system 108 and computers 110 to build an intranet. The host management system 108 has a gateway for connecting the LAN 109 to Internet 105 as an external network of the business office, and a security function for limiting external accesses.

Reference numerals 102 to 104 denote manufacturing factories of the semiconductor manufacturer as users of manufacturing apparatuses. The manufacturing factories 102 to 104 may belong to different manufacturers or the same manufacturer (pre-process factory, post-process factory, and the like). Each of the factories 102 to 104 is equipped with a plurality of manufacturing apparatuses 106, a LAN (Local Area Network) 111, which connects these apparatuses 106 to construct an intranet, and a host management system 107 serving as a monitoring apparatus for monitoring the operation status of each manufacturing apparatus 106. The host management system 107 in each of the factories 102 to 104 has a gateway for connecting the LAN 111 in the factory to the Internet 105 as an external network of the factory. Each factory can access the host management system 108 of the vendor 101 from the LAN 111 via the Internet 105. The security function of the host management system 108 authorizes access of only a limited user. More specifically, the factory notifies the vendor via the Internet 105 of status information (e.g., the symptom of a manufacturing apparatus in trouble) representing the operation status of each manufacturing apparatus 106, and receives response information (e.g., information designating a remedy against the trouble, or remedy software or data) corresponding to the notification, or maintenance information such as the latest software or help information. Data communication between the factories 102 to 104 and the vendor 101 and data communication via the LAN 111 in each factory adopt a communication protocol (TCP/IP) generally used in the Internet. Instead of using the Internet as an external network of the factory, a dedicated network (e.g., an ISDN) having high security which inhibits access of a third party can be adopted. Also, the user may construct a database in addition to the one provided by the vendor and set the database on an external network, and the host management system may authorize access to the database from a plurality of user factories.

Figure 8:
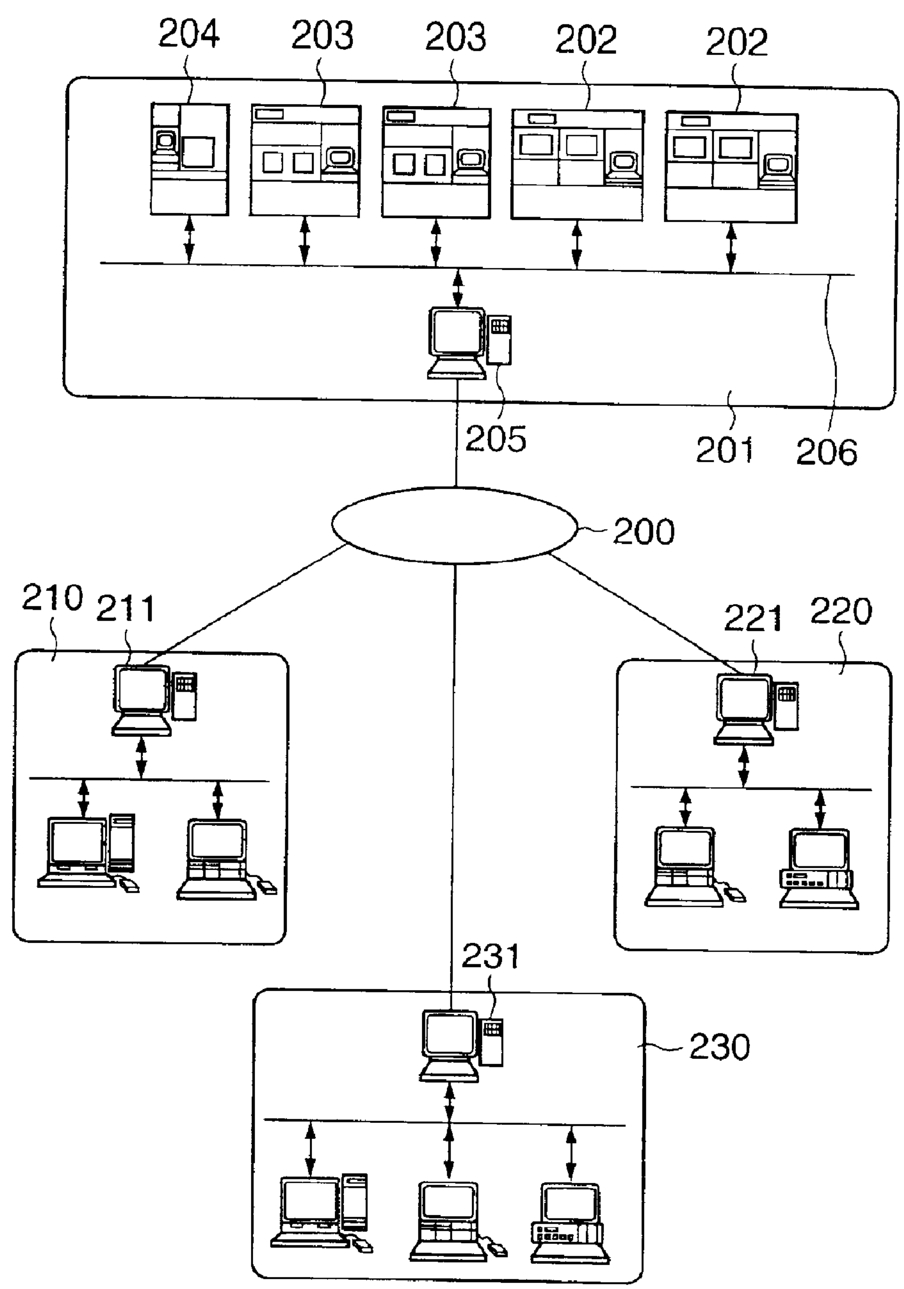
FIG. 8 is a view showing the concept of the semiconductor device production system including the exposure apparatus according to the embodiment of the present invention when viewed from another given angle.

FIG. 8 is a view showing the concept of the overall system of this embodiment that is cut out at a different angle from FIG. 7. In the above example, a plurality of user factories having manufacturing apparatuses and the management system of the manufacturing apparatus vendor are connected via an external network, and production management of each factory or information of at least one manufacturing apparatus is communicated via the external network. In the example of FIG. 8, a factory having manufacturing apparatuses of a plurality of vendors and the management systems of the vendors for these manufacturing apparatuses are connected via the external network of the factory, and maintenance information of each manufacturing apparatus is communicated. In FIG. 8, reference numeral 201 denotes a manufacturing factory of a manufacturing apparatus user (semiconductor device manufacturer) where manufacturing apparatuses for performing various processes, e.g., an exposure apparatus 202, a resist processing apparatus 203, and a film formation apparatus 204 are installed in the manufacturing line of the factory. FIG. 8 shows only one manufacturing factory 201, but a plurality of factories are networked in practice. The respective apparatuses in the factory are connected to a LAN 206 to build an intranet, and a host management system 205 manages the operation of the manufacturing line. The business offices of vendors (apparatus supply manufacturers) such as an exposure apparatus manufacturer 210, a resist processing apparatus manufacturer 220, and a film formation apparatus manufacturer 230 comprise host management systems 211, 221, and 231 for executing remote maintenance for the supplied apparatuses. Each host management system has a maintenance database and a gateway for an external network, as described above. The host management system 205 for managing the apparatuses in the manufacturing factory of the user, and the management systems 211, 221 and 231 of the vendors for the respective apparatuses are connected via the Internet or dedicated network serving as an external network 200. If trouble occurs in any one of a series of manufacturing apparatuses along the manufacturing line in this system, the operation of the manufacturing line stops. This trouble can be quickly solved by remote maintenance from the vendor of the apparatus in trouble via the Internet 200. This can minimize the stoppage of the manufacturing line.

Each manufacturing apparatus in the semiconductor manufacturing factory comprises a display, a network interface, and a computer for executing network access software and apparatus operating software, which are stored in a storage device. The storage devices is a built-in memory, hard disk, or network file server. The network access software includes a dedicated or general-purpose web browser and provides a user interface having a window as shown in FIG. 9 on the display. While referring to this window, the operator who manages manufacturing apparatuses in each factory inputs, in input items on the windows, pieces of information such as the type of manufacturing apparatus 401, serial number 402, subject of trouble 403, occurrence date 404, degree of urgency 405, symptom 406, remedy 407, and progress 408. The pieces of input information are transmitted to the maintenance database via the Internet, and appropriate maintenance information is sent back from the maintenance database and displayed on the display. The user interface provided by the web browser realizes hyperlink functions 410, 411, and 412, as shown in FIG. 9. This allows the operator to access detailed information of each item, receive the latest-version software to be used for a manufacturing apparatus from a software library provided by a vendor, and receive an operation guide (help information) as a reference for the operator in the factory. Maintenance information provided by the maintenance database also includes information concerning the present invention described above. The software library also provides the latest software for implementing the present invention.

Figure 10:
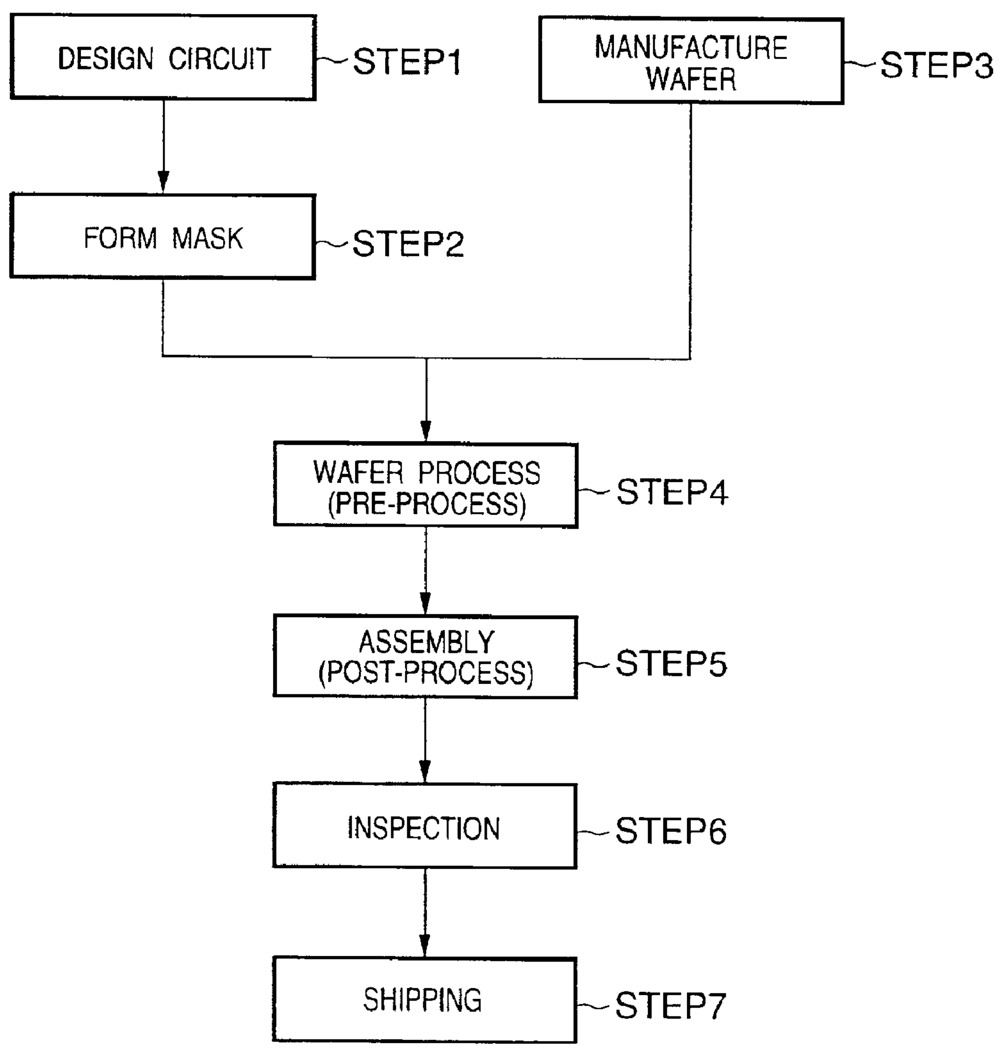
FIG. 10 is a flow chart for explaining the flow of a device manufacturing process by the exposure apparatus according to the embodiment of the present invention.

A semiconductor device manufacturing process using the above-described production system will be explained. FIG. 10 shows the flow of the whole manufacturing process of the semiconductor device. In step 1 (circuit design), a semiconductor device circuit is designed. In step 2 (mask formation), a mask having the designed circuit pattern is formed. In step 3 (wafer manufacture), a wafer is manufactured by using a material such as silicon. In step 4 (wafer process), called a pre-process, an actual circuit is formed on the wafer by lithography using a prepared mask and the wafer. Step 5 (assembly), called a post-process, is the step of forming a semiconductor chip by using the wafer manufactured in step 4, and includes an assembly process (dicing and bonding) and a packaging process (chip encapsulation). In step 6 (inspection), inspections such as the operation confirmation test and durability test of the semiconductor device manufactured in step 5 are conducted. After these steps, the semiconductor device is completed and shipped (step 7). For example, the pre-process and post-process are performed in separate dedicated factories, and maintenance is done for each of the factories by the above-described remote maintenance system. Information for production management and apparatus maintenance is communicated between the pre-process factory and the post-process factory via the Internet or dedicated network.

Figure 11:
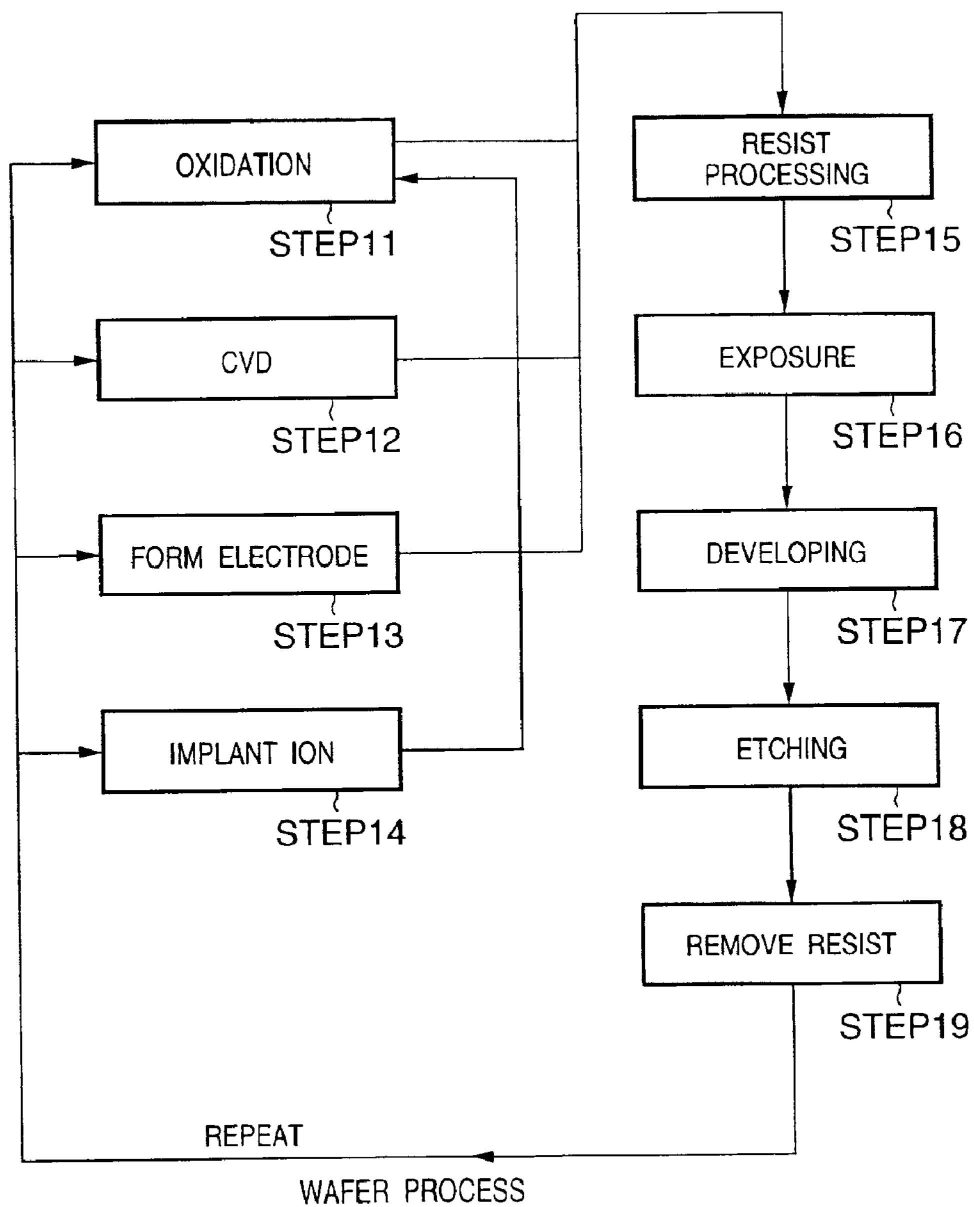
FIG. 11 is a flow chart for explaining the flow of a wafer process by the exposure apparatus according to the embodiment of the present invention.

FIG. 11 shows the detailed flow of the wafer process. In step 11 (oxidation), the wafer surface is oxidized. In step 12 (CVD), an insulating film is formed on the wafer surface. In step 13 (electrode formation), an electrode is formed on the wafer by vapor deposition. In step 14 (ion implantation), ions are implanted in the wafer. In step 15 (resist processing), a photosensitive agent is supplied to the wafer. In step 16 (exposure), the above-mentioned exposure apparatus exposes the wafer to the circuit pattern of a mask. In step 17 (developing), the exposed wafer is developed. In step 18 (etching), the resist is etched except for the developed resist image. In step 19 (resist removal), an unnecessary resist after etching is removed. These steps are repeated to form multiple circuit patterns on the wafer. A manufacturing apparatus used in each step undergoes maintenance by the remote maintenance system, which prevents trouble in advance. Even if trouble occurs, the manufacturing apparatus can be quickly recovered. The productivity of the semiconductor device can be increased in comparison with the prior art.

The above embodiments can provide a pipe structure which is flexible, is high in durability against repetitive deformation, and is suitable for connection to a movable member (stage) while suppressing the influence of degassing or gas permeation from a pipe itself.

The use of a resin material almost free from degassing for an outer pipe can reduce degassing from all the pipes and reduces any adverse effect on the vacuum degree in a vacuum chamber. The use of a flexible resin material for an inner pipe increases the flexibility of all the pipes. The thickness of the outer pipe is set to be as small as about 0.1 mm or less, so that the flexibility of all the pipes can be maintained.

The influence of degassing can also be prevented by applying the above-mentioned arrangement not to the inner pipe but to an electrical wire. Piping to a movable member (stage) can be simplified by airtightly covering with one outer pipe an entire piping member to the movable member (stage) as a combination of two or more inner pipes and/or electrical wires. At this time, it is effective to align the inner pipes or electrical wires one-dimensional in the longitudinal direction of the pipe section because this arrangement can secure a bending direction in which the flexural rigidity of the pipes (including electrical wires used instead of some or all of the inner pipes) is low.

In constituting an alignment apparatus in the vacuum chamber, these pipes (including electrical wires used instead of some or all of the inner pipes) are used for connection to the movable member (stage), thereby reducing a nonlinear load by movement. This can increase the alignment precision.

The present invention is not limited to the above embodiments and various changes and modifications can be made within the spirit and scope of the present invention. Therefore, to apprise the public of the scope of the present invention the following claims are made.

What is claimed is:

1. A pipe structure comprising:

a double pipe having a resin inner pipe and a resin outer pipe covering an outside of the inner pipe; and a vacuum pump for discharging gas in a space between the inner pipe and the outer pipe, wherein the double pipe is in a chamber, pressure in a space between the chamber and the outer pipe is less than pressure in a space between the inner pipe and the outer pipe, and the pressure in the space between the inner pipe and the outer pipe is less than the pressure in the inner pipe.

2. The structure according to claim 1, wherein the inner pipe or the outer pipe has a bellows structure or coil shape.

3. The structure according to claim 1, wherein the inner pipe in the outer pipe includes a plurality of inner pipes.

4. The structure according to claim 1, wherein the inner pipe is formed from a more flexible resin material than that of the outer pipe.

5. The structure according to claim 1, wherein the inner pipe is formed from a resin material having a flexibility different from a material of the outer pipe.

6. The structure according to claim 1, wherein the outer pipe is formed from a resin material so that an occurrence of degassing of the outer pipe is less than that of the inner pipe.

7. The structure according to claim 1, wherein the outer pipe is thinner than the inner pipe.

8. The structure according to claim 1, wherein the outer pipe has a thickness of about 10 μm to about 100 μm.

9. The structure according to claim 1, further comprising a movable stage in the chamber, wherein said double pipe is coupled to the movable stage and an outer surface of said double pipe is exposed to a vacuum atmosphere in the chamber.

10. A pipe structure comprising:

a double pipe having a resin inner pipe and a resin outer pipe covering an outside of the inner pipe; and a vacuum pump for discharging gas in a first space between the inner pipe and the outer pipe, wherein the double pipe is in a chamber, pressure in a second space between the chamber and the outer pipe is less than pressure in the first space, and the pressure in the first space is less than the pressure in a third space in the inner pipe, and wherein the first, the second and the third spaces are independent of each other.

* * * * *

UNITED STATES PATENT AND TRADEMARK OFFICE

CERTIFICATE OF CORRECTION

PATENT NO. : 6,915,179 B2
DATED : July 5, 2005
INVENTOR(S) : Keiji Emoto

Figure 12:
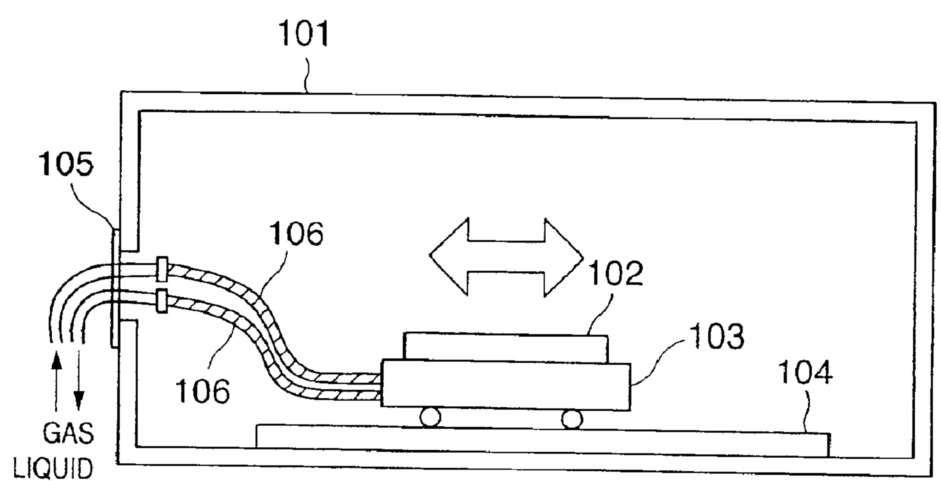
FIG. 12 is a schematic view showing a movable alignment apparatus arranged in a conventional vacuum chamber and its pipe.
Figure 12:
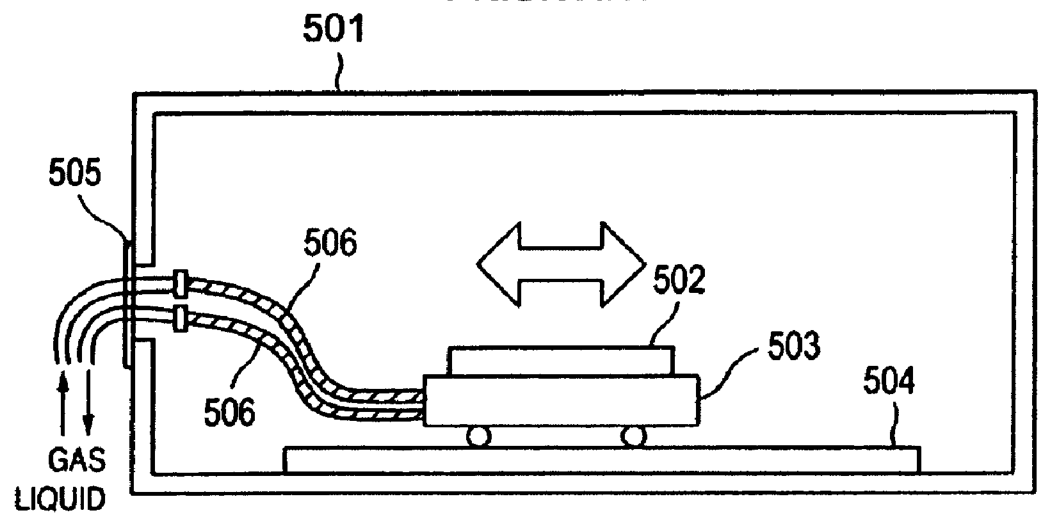

It is certified that error appears in the above-identified patent and that said Letters Patent is hereby corrected as shown below:

Drawings,
Sheet 8 of 8, in "FIG. 12," directly underneath "FIG. 12" insert -- PRIOR ART --.

Column 1,
Line 58, "influence" should read -- influences --.

Column 5,
Line 46, "8.to" should read -- 8 to --.

Column 6,
Line 2, "of" should read -- for --
Line 29, "slower" should read -- more slowly --.

Column 10,
Line 37, "one-dimensional" should read -- one-dimensionally --.

Signed and Sealed this

Twentieth Day of December, 2005

JON W. DUDAS
*Director of the United States Patent and Trademark Office*